US006963338B1

(12) United States Patent
Bachelder et al.

(10) Patent No.: US 6,963,338 B1
(45) Date of Patent: Nov. 8, 2005

(54) METHOD FOR REFINING GEOMETRIC DESCRIPTION MODELS USING IMAGES

(75) Inventors: Ivan A. Bachelder, Newton, MA (US); Cyril C. Marrion Jr., Acton, MA (US)

(73) Assignee: Cognex Corporation, Natick, MA (US)

( * ) Notice: Subject to any disclaimer, the term of this patent is extended or adjusted under 35 U.S.C. 154(b) by 0 days.

(21) Appl. No.: 09/127,676

(22) Filed: Jul. 31, 1998

(51) Int. Cl.$^7$ .............................................. G06T 15/00
(52) U.S. Cl. ....................... 345/420; 382/151; 382/219
(58) Field of Search ................................ 345/433, 418, 345/419, 420; 382/151, 154, 219, 236

(56) References Cited

U.S. PATENT DOCUMENTS

| | | | |
|---|---|---|---|
| 4,980,971 A | 1/1991 | Bartschat et al. ............. 29/833 |
| 5,060,276 A | 10/1991 | Morris et al. ................ 382/151 |
| 5,113,565 A | 5/1992 | Cipolla et al. ............. 29/25.01 |
| 5,226,095 A | 7/1993 | Okumura et al. ........... 382/151 |
| 5,268,999 A | 12/1993 | Yokoyama .................. 345/441 |
| 5,343,028 A | 8/1994 | Figarella et al. ....... 235/462.09 |
| 5,371,690 A | 12/1994 | Engel et al. ................ 382/151 |
| 5,471,541 A | 11/1995 | Burtnyk et al. ............. 382/153 |
| 5,495,537 A | 2/1996 | Bedrosian et al. .......... 382/209 |
| 5,497,451 A | 3/1996 | Holmes ....................... 345/420 |
| 5,500,906 A | 3/1996 | Picard et al. ................ 382/220 |
| 5,545,887 A | 8/1996 | Smith et al. ........... 235/462.08 |
| 5,602,937 A | 2/1997 | Bedrosian et al. .......... 382/151 |
| 5,621,807 A | 4/1997 | Eibert et al. ................ 382/103 |
| 5,625,715 A | 4/1997 | Trew et al. .................. 382/236 |
| 5,627,912 A | 5/1997 | Matsumoto ................. 382/146 |
| 5,627,915 A | 5/1997 | Rosser et al. ............... 382/219 |
| 5,663,809 A | 9/1997 | Miyaza et al. .............. 358/450 |
| 5,828,769 A | 10/1998 | Burns ......................... 382/118 |
| 5,845,288 A | 12/1998 | Syeda-Mahmood ......... 707/102 |
| 5,850,469 A | 12/1998 | Martin et al. ............... 382/154 |
| 5,974,169 A | 10/1999 | Bachelder ................... 382/151 |
| 6,324,299 B1 * | 11/2001 | Sarachik et al. ............ 382/151 |
| 6,516,092 B1 * | 2/2003 | Bachelder et al. .......... 382/181 |

OTHER PUBLICATIONS

Medina-Mora, Raul, "An Incemental Programming Environment," *IEEE Transactions on Software Engineering*, Sep. 1981, pp. 472-482, vol. SE-7, No. 5, USA.

Ullman, Shimon, "Aligning pictorial descriptions: An approach to object recognition, I: Approaches to Object Recognition," reprinted from *Cognition*, Aug. 1989, pp. 201-214, vol. 32, No. 3, Cambridge, MA, USA.

Hoogs et al., "Model-Based Learning of Segmentations", IEEE, pp. 494-499, 1996.

Newman et al., "3D CAD-Based Inspection I: Coarse Verification", IEEE, pp. 49-52, 1992.

* cited by examiner

*Primary Examiner*—Phu K. Nguyen
(74) *Attorney, Agent, or Firm*—Russ Weinzimmer

(57) ABSTRACT

The creation of accurate geometric description-based models of objects in a machine vision system can be performed in a computer-assisted process. A rough model of an image of an object forms the basis of the model. The model is refined through the application of machine vision tools and techniques so as to provide a model including a geometric description. The model can be used in machine vision applications that may be used, for example, to compare images of objects under inspection to the model.

9 Claims, 5 Drawing Sheets

METHOD FOR REFINING GEOMETRIC DESCRIPTION MODELS USING IMAGES

FIELD OF THE INVENTION

This invention relates to machine vision, and particularly to machine vision systems that use geometric descriptions as models.

BACKGROUND OF THE INVENTION

Many machine vision systems use geometric descriptions (GD) as canonical models for inspecting or recognizing objects within images. Often, such GD-based models must accurately reflect the physical dimensions of objects so that the exact position of the objects can be determined in an image, and so that precise tolerance checking and defect detection can be performed. For example, vision-based automatic surface mounter (SMD) machines typically employ GD-based models of leaded devices and chips to accurately inspect and place them such that their leads substantially contact the pads of a printed circuit board.

The process of creating accurate GD-based models of objects, either by manually measuring the dimensions of an object, or by extracting the dimensions from manufacturer specifications, can be very tedious, especially when the objects are complicated. Furthermore, there are always new objects to inspect, which means the process of creating an accurate GD-based model must be performed repeatedly. For example, in addition to the many types of leaded components, BGA devices, and chips that SMD mounter manufacturers must describe to create models, there are all sorts of complicated odd-form components, such as coils and connectors.

Existing methods, such as normalized correlation search, typically create featural models (e.g. the 2D spatial arrangement of features such as edges or intensity values based on the appearance of an object), or surface representations (e.g., a 3D volumetric representation of an object's surface) rather than GDs. Thus, there currently exists a need for a method for easily creating GD models.

SUMMARY OF THE INVENTION

To create a refined GD from an image, a rough GD of an object is provided, for example, by manually drawing a graphical depiction of the object on top of its image, using a GUI, for example, and/or by using CAD data. Next, the rough GD is refined such that it more closely fits an instance of the object in the image.

The resulting GD is general enough to be used in conjunction with certain automatic inspection or recognition tools that require GDs as input, such as the tool described in co-pending U.S. patent application Ser. No. 09/054,968, filed Apr. 3, 1998, entitled "Object Image Search Using Sub-models". The result is a GD that may easily be interpreted, drawn, and even edited by a user in meaningful, intuitive (i.e. geometric) ways. Furthermore, the GD is more compact than featural descriptions of the object.

This invention is a method for refining GD models of objects such as the body of an odd-form SMD device. In a preferred embodiment, the method allows the user to quickly sketch a set of rough lines (and/or arcs) so as to specify a curvilinear GD model of the object upon the image, which is then automatically refined so as to substantially conform to the high contrast boundaries in the image. The user (or client) may specify a number of geometric constraints to facilitate this refinement process, such as the requirement that each of the vertices of the final refined curvilinear GD model have right angles. Following this refinement process, the user may then correct any remaining inaccuracies in the GD model by graphically dragging and dropping the curvilinear vertices and segments using a GUI (graphical user interface).

The invention is useful in a variety of areas where geometric model-based machine vision is employed, including general-purpose end-user machine vision systems. Moreover, the invention allows the creation of GD-based models that are graphically editable.

The invention can be used with any application requiring GD models for objects. This includes not only automatic recognition and inspection applications, but also CAD/CAM applications.

BRIEF DESCRIPTION OF THE DRAWING

The invention will be more fully understood from the following detailed description, in conjunction with the accompanying figures, wherein.

DETAILED DESCRIPTION OF THE PREFERRED EMBODIMENTS

For clarity, method steps are indicated by reference numbers in parentheses, and elements are indicated with standard reference numbers. To enhance comprehension, the invention will first be explained in general terms, and will then be explained in further detail.

Figure 1:
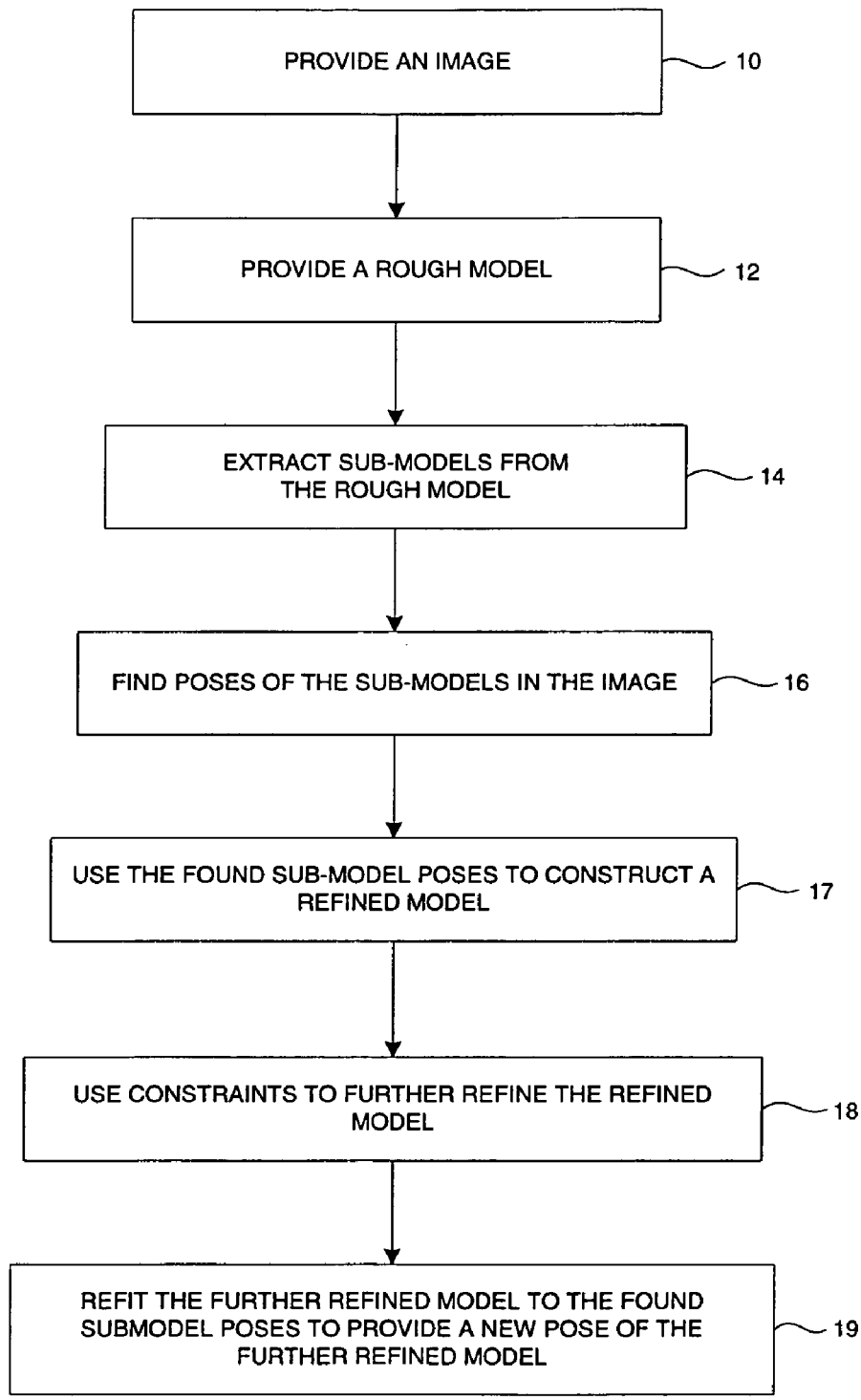
FIG. 1 is a flow chart showing the main steps of the invention.
Figure 2A:
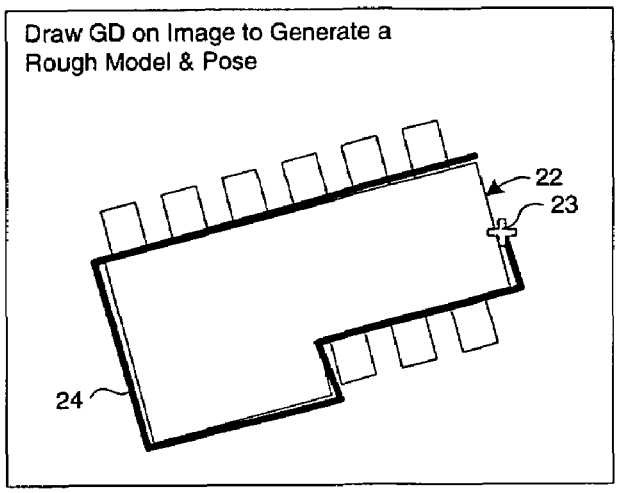
FIGS. 2A–2E is a sequence of representations of an exemplary image of an object and a rough curvilinear model, sub-models of the rough models, and the found poses thereof, a refined model, and a constrained refined model.

Referring to FIG. 1 and the sequence of FIGS. 2A–2E, preliminarily, an image 20 is provided (10). In a preferred embodiment, a user (or any client) provides a rough geometric description (GD) model (12) of the object 22 in the image 20. This can be done simply by drawing with cursor 23 the model 24 over the image of the object 22, as shown in FIG. 2A. Here, the model consists of a polygon 24 drawn by the user.

Figure 2B:
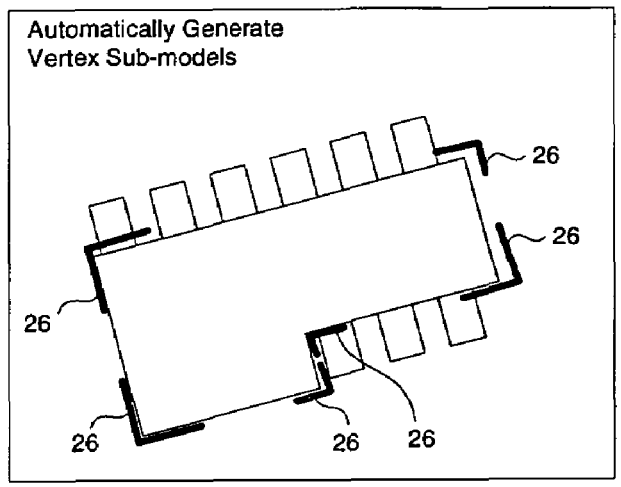

Next, the sub-models 26 of FIG. 2B of the model 24 are extracted (14) from the model (here shown in their original rough poses) as explained in either of co-pending U.S. patent application Ser. No. 09/054,968, filed Apr. 3, 1998, entitled "Object Image Search Using Sub-models", herein incorporated by reference, or co-pending U.S. patent application Ser. No. 09/086,904, filed May 29, 1998, entitled "Robust Sub-model Shape-finder", herein incorporated by reference.

Figure 2C:
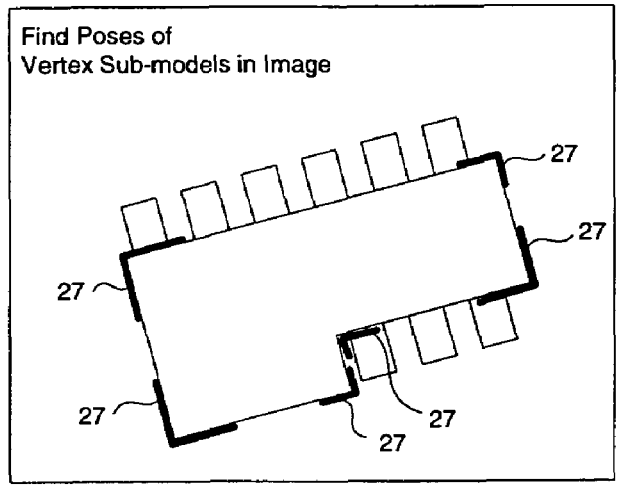

Then, poses 27 of the sub-models 26 are found (16) in the image 20, as shown in FIG. 2C. This means that the sub-models are used to search the image 20 for portions that resemble the sub-model, and the result of the search is a plurality of multi-dimensional positions (poses) that the sub-models must assume to match respective portions of the image. Each multi-dimensional position can include the usual dimensions of translational position, e.g., x,y position, but also can include the rotational angle, skew, scale, etc. that the sub-model must exhibit to match that portion of the image. Further details of this step (16) will be provided below.

Figure 2D:
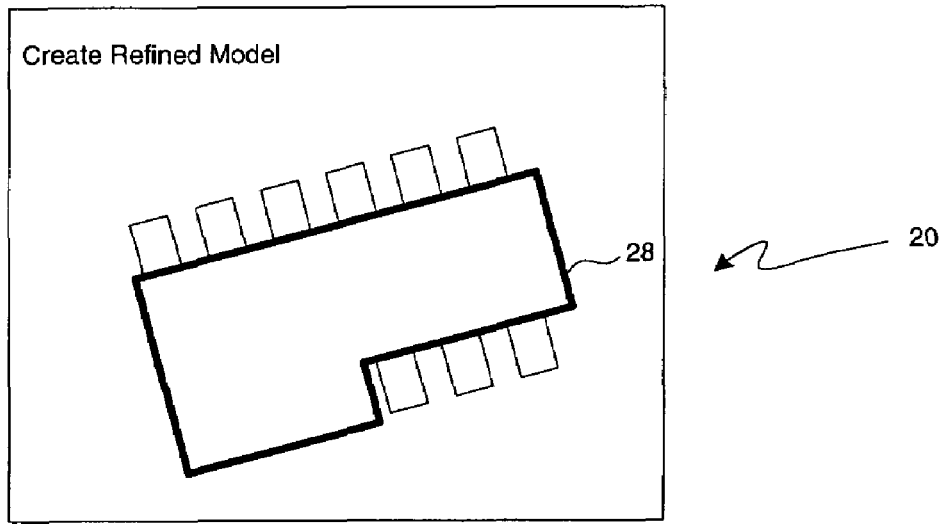

With reference to FIG. 2D, next, the found sub-model poses 27 are used (17) to construct a refined model 28, as explained in further detail below.

Figure 2E:
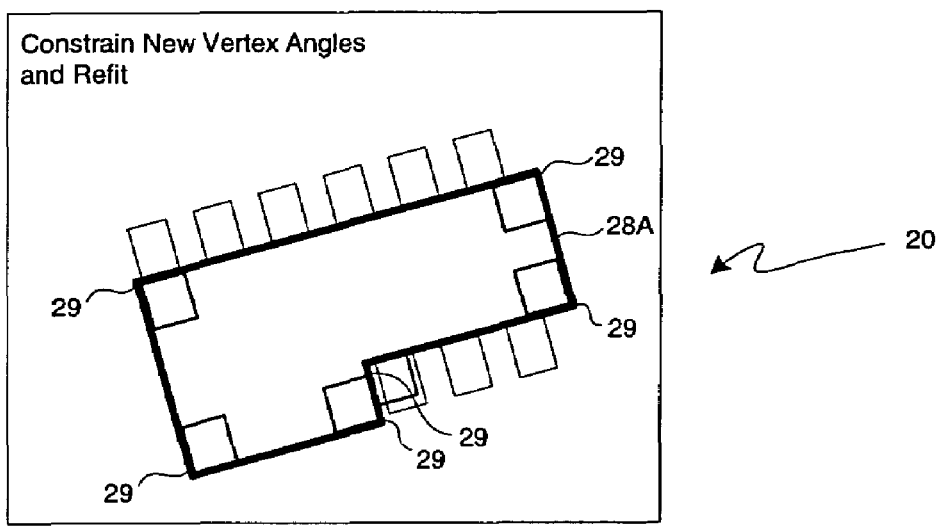

As illustrated in FIG. 2E, optionally, constraints can be used to further refine the refined model (18). Examples of constraints include requiring that each corner 29 of the model be characterized by an angle of 90 degrees. Using constraints to further refine the model will be explained in further detail below.

Also optionally, the further refined model 28 can be refit (19) to the found sub-model poses to provide a new pose 28A of the further refined model 28.

Figure 3:
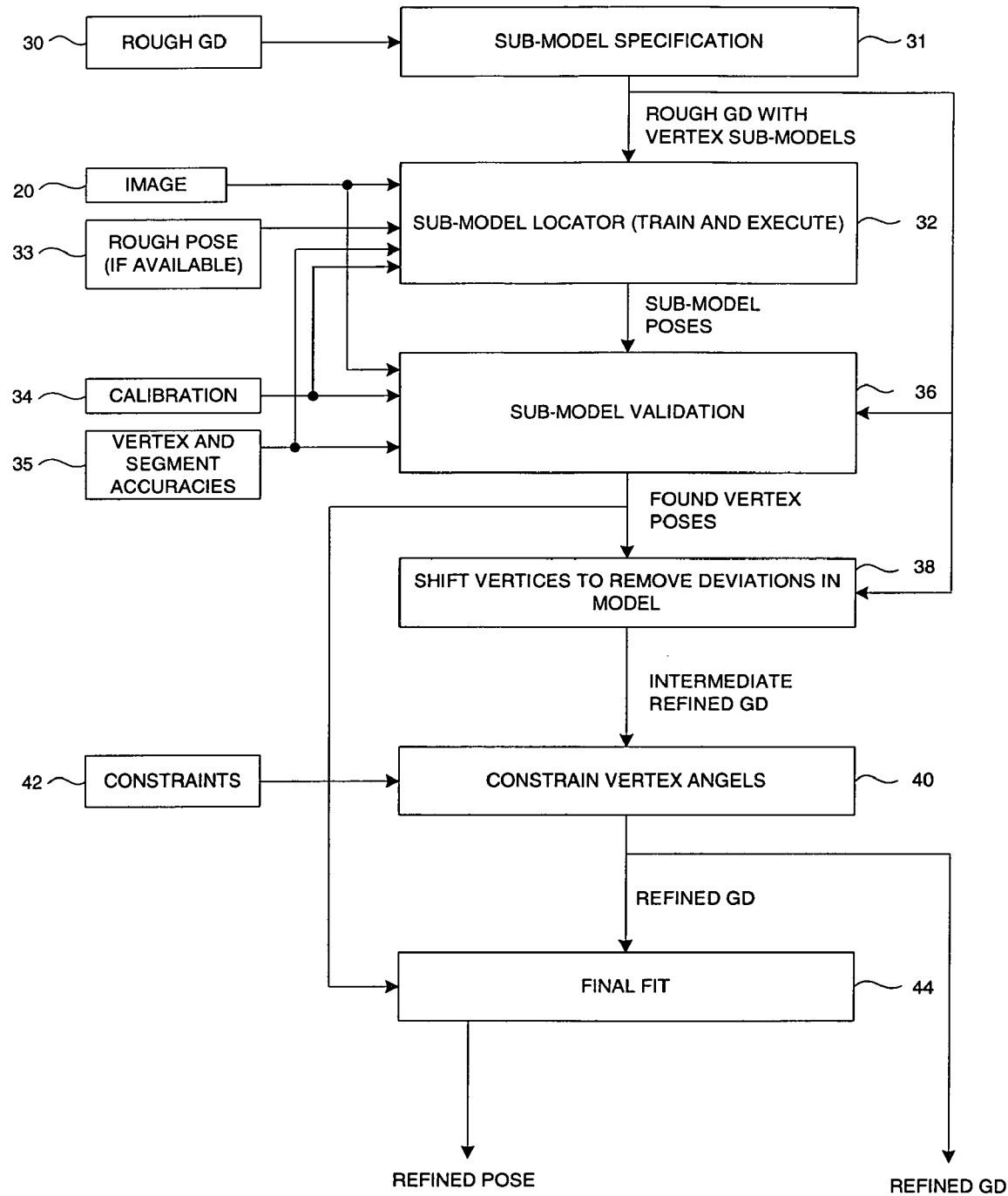
FIG. 3 is a detailed flow chart of the steps of a preferred embodiment of the invention.
Figures 4A, 4B:
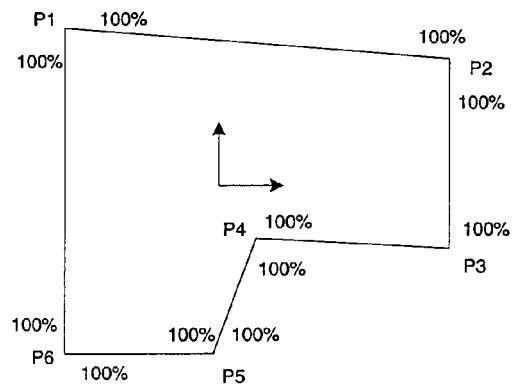
FIG. 4A is a full model showing overlapping sub-models of the full model.
FIG. 4B is an illustration of a sub-model table having pointers to a storage array of normalized models and sub-models, and the image search models corresponding thereto.

Referring to FIG. 3, providing further details of step 14 of FIG. 1, a rough geometric description (GD) model for an object is specified (30) as a curvilinear shape with sub-models, as generally outlined in the co-pending U.S. patent application Ser. No. 09/054,968, filed Apr. 3, 1998, entitled "Object Image Search Using Sub-models". Sub-models for each of the vertices in the supplied rough GD model 30 are automatically generated (31). Automatic generation may, for example, be similar to assigning one sub-model per vertex, as described in the co-pending U.S. patent application Ser. No. 09/054,968, filed Apr. 3, 1998, entitled "Object Image Search Using Sub-models". The percentages of the segments connected by each vertex contributing to each sub-model might, for example, be determined using the maximization strategy described in the model specification section of the co-pending U.S. patent application Ser. No. 09/086,904, filed May 29, 1998, entitled "Robust Sub-model Shape-finder". Note that using this combination of strategies for sub-model specification results in a set of overlapping "corner shapes", one per vertex, as shown in FIG. 4A. However, it is also possible to use other percentages for the sub-models for the purposes of the present invention.

Further elaborating on step 16 of FIG. 1, finding poses (32) of the sub-models in the image involve two phases: training and execution (searching).

Training: Given the model specification 30 (e.g., the polygon 24 of FIG. 1) created by the client, as well as the sub-model specification determined automatically (31) as described above, training progresses in the manner described in co-pending U.S. patent application Ser. No. 09/054,968, filed Apr. 3, 1998, entitled "Object Image Search Using Sub-models". If a rough pose 33 of the model within client space has been provided (as is the case when the rough GD 24 has been created by directly "drawing" it over an image of the object), training only needs to be performed for the FPL (fine part location) portion of the sub-model locator. Otherwise, the user (client) provides the sub-sample factor that will be used to train the full model and subsequently run the CPL (coarse part location) phase of the sub-model locator 32. The user also provides the calibration transformation 34. The calibration transformation is the transformation between the client coordinate system and the image coordinate system, where, for example, the client coordinate system can be the physical world coordinate system. Thus, in this case, the client coordinate system relates results from the image coordinate system to physical world coordinate system.

Note that this training usually results in a normalized "corner shape" and its respective search model for each vertex in the GD (see FIG. 4B, which figure is explained in further detail in co-pending U.S. patent application Ser. No. 09/054,968, filed Apr. 3, 1998, entitled "Object Image Search Using Sub-models"). Typically, a coarse search model, such as a PATQUICK search model, is trained for the full model (if CPL is required), and fine search models, such as PATMAX search models, are trained for each of the sub-model descriptions. When training image search models for the sub-models, any corner rounding specified in the original model is typically modeled explicitly rather than ignored.

An alternative to finding the full model and the sub-models using PATQUICK and PATMAX would be to use normalized correlation, GHT, or any other search technique. To search over the degrees of freedom (e.g. skew) that are not normally handled by these techniques, one would simply search for many different versions of the sub-models. The different versions of the sub-models are created by transforming the original sub-model by a sampling of transformations within the combined uncertainty ranges for each such degree of freedom. Then, take the pose of the sub-model with the best score (for example, correlation score) as the pose of the found sub-model. For example, if the skew uncertainty range were between −5 and 5 degrees, and the aspect uncertainty range were between 0.9 and 1.1, then one could create a set of transformed sub-models, where the transformations used to create these sub-models combine all skews at 1 degree intervals between −5 and 5 degrees with all aspect ratios at 0.01 intervals between 0.9 and 1.1, and then use normalized correlation to find each of the sub-models. Composing the transform associated with the sub-model found with the largest score with the position at which that sub-model was found would then yield the found pose for the original sub-model.

Execution: Following the training phase, the CPL phase of the sub-model locator is executed on an image of the object supplied by the client in order to determine a rough pose of the GD in the image (if one has not been provided by the client), followed by the FPL phase of the locator. The execution of these stages is described in the co-pending U.S. patent application Ser. No. 09/054,968, filed Apr. 3, 1998, entitled "Object Image Search Using Sub-models". For CPL (if executed), the client supplies the translational, rotational, angular, aspect, and any other uncertainties of the object. Note that the translational uncertainty is typically specified implicitly by providing only a region of interest (ROI) of the run-time image. For FPL, the client provides two parameters 35: the segment accuracy parameter is the upper bound on the angular uncertainty of each of the segments in the GD, and the vertex accuracy is an upper bound on the positional uncertainty of each of the vertices in the GD. These two parameters 35 are used to generate the translational, angular, and skew uncertainties for each of the sub-models (the uncertainties for other degrees of freedom are usually assumed to be negligible).

Specifically, the positional uncertainty of each sub-model is set to the vertex accuracy parameter, while the angular and skew uncertainties of the sub-models are set to twice the segment accuracy parameter (since there are two segments per sub-model) 35. The vertex accuracy parameter is an error radius around the vertex that indicates where to search for a vertex, and the segment accuracy parameter is a range of angles. Typically, segment and vertex accuracies are on the order of a few pixels and a few degrees, respectively. Note that larger accuracy parameters result in the method being more tolerant to large variations in the GD, but will also cause the method to execute slowly (at least on serial machines) and will increase the chance of confusing the various sub-models in the image. Thus, a smaller accuracy parameter will provide more disambiguation of sub-models, and greater speed, but may eliminate some sub-models from consideration.

Note that the final fit degrees of freedom input is not important here, since the final pose is not used (Also, any errors resulting from the final fit are not used). Running the FPL stage of the locator tool effectively projects the sub-models for each vertex into the image according to both their poses within the rough model and the rough pose of the model in the image, then finds their poses in the image. This operation produces a set of found sub-model poses.

Sub-model Validation (36): Assuming that an error has not occurred when running the shape-finder tool (see the co-pending U.S. patent application Ser. No. 09/054,968, filed Apr. 3, 1998, entitled "Object Image Search Using Sub-models" for a description of such errors), the method then employs the methods for validating sub-models and refining the model pose as described in the co-pending U.S. provisional patent application Ser. No. 60/080,682, filed Apr. 3, 1998, entitled "Improved Object Image Search using Validated Sub-model Poses", herein incorporated by reference. The inter sub-model checks include discarding those sub-models found with low search scores (anything lower than 0.5, for example, when using the Cognex Patmax tool as the underlying search model), and those sub-models that have high RMS fit errors (the threshold for which depends on the application).

Intra sub-model checks include discarding sub-models based on deviation between their found pose in client space and their expected pose according to the CPL model pose provided by the sub-model based shape finder tool disclosed in co-pending U.S. patent application Ser. No. 09/086,904, filed May 29, 1998, entitled "Robust Sub-model Shape-finder". The deviation thresholds used for this discard phase are determined using the vertex and segment accuracy parameters discussed above. Specifically, the translation limits are set to the vertex accuracy parameters, while the angle and skew limits are set to twice the segment accuracy parameter. Other limits are usually not set.

Shift Vertices to Remove Deviations in Model (38): The remaining found vertex poses are used to compute the vertex refinement to the initial rough GD such that all deviations in the image are removed, thereby creating an intermediate refined GD, which is generally the result of step (17) in FIG. 1. Specifically, the vertex pose for each found vertex is transformed back into model space (using the rough pose and the pose of the sub-models in the model) in order to determine the new x,y positions for that vertex in the new intermediate GD. Note that vertices that have not been found (or have been discarded) keep their original positions.

Constrain Vertex Angles (40)(also step (18)): If any constraints 42 on the GD have been specified by the client, the intermediate GD is then modified to conform to those constraints. Examples of such constraints include the stipulation that the final refined GD contain only 90 degree segments, or that all linear segments must be either horizontal or vertical. These constraints are satisfied by processing the intermediate GD using the following steps:

1. The dominant angle of the intermediate refined GD is computed by continually adding 90 degrees to each of the segment angles in the model until they all fall in the first quadrant, then taking the average of these new angles.

2. The intermediate model is rotated by minus the dominant angle. At this point, all segments in the model should be roughly vertical or horizontal.

3. For each vertex, if there is a vertical segment connected by that vertex, then the X coordinate of the vertex is set to the X coordinate centroid of that segment; if there is a horizontal segment connected by the vertex, then the Y coordinate is set to the Y coordinate of the centroid of that segment.

4. If the segments are not constrained to be horizontal or vertical, the model is rotated back by the dominant angle.

If no constraints are specified, then no changes are made to the intermediate GD.

Final Fit (44) (also step (19)): The found vertex poses from the sub-model based shape finder are fit to the corresponding vertices in the (final) refined GD in order to produce the final pose of the GD in the image. The fit may be performed, for example, in a manner similar to that described in co-pending U.S. patent application Ser. No. 09/054,968, filed Apr. 3, 1998, entitled "Object Image Search Using Sub-models", or in the co-pending U.S. provisional patent application Ser. No. 60/080,682, filed Apr. 3, 1998, entitled "Improved Object Image Search using Validated Sub-model Poses". This fit yields a final (refined) pose for the refined GD in the image.

FIGS. 2A–2E schematically illustrate the various stages of how a client might use the model refiner method of the invention on an image of a surface mount device with a rectilinear body.

FIG. 2A shows the rough model 24 for the device body 22 being drawn by the client to within 5 pixels for each vertex, and to within 5 degrees for each segment, the process of which determines by the rough GD and rough pose for the body.

FIG. 2B shows the decomposition of the model into sub-models 26 at each vertex, as projected into the image by the rough pose.

FIG. 2C shows the found sub-model poses 27 that result from running the FPL phase of the shape locator (note that the CPL phase was not required here, and, in this case, no sub-models were discarded). (Note: for purposes of illustration, this particular version of the tool used very small percentages to create the sub-models, so that they do not overlap as they typically do).

FIG. 2D shows the resulting refined model 28 provided by the invention.

FIG. 2E shows the further refined GD 28A with 90 degree corners 29 (thereby satisfying the 90 degree constraint specified by the client), as projected into the image by the refined pose.

Other modifications and implementations will occur to those skilled in the art without departing from the spirit and the scope of the invention as claimed. Accordingly, the above description is not intended to limit the invention except as indicated in the following claims.

What is claimed is:

1. A method for refining a geometric description model of an object using an image of that object, the method comprising:
providing an image of the object;
providing a rough geometric description model of the object;
extracting sub-models from the rough geometric description model;
finding poses of the sub-models in the image;
using the found sub-models to construct a refined geometric description model;
using constraints to further refine the refined geometric description model; and refitting the further refined geometric description model to the found sub-model poses to provide a new pose of the further refined geometric description model.

2. The method of claim 1, wherein one of the constraints is an angular constraint.

3. The method of claim 1, wherein the model includes a wire frame structure.

4. The method of claim 3, wherein the wire frame structure includes vertices and segments connected thereto.

5. The method of claim 1, wherein the refined model for the object is required to satisfy certain user-defined geometric constraints.

6. The method of claim 5, wherein the geometric constraints specify that segments must form 90 degree angles at vertices.

7. The method of claim 1, wherein finding poses of the sub-models in the image includes:
validating the poses of the sub-models.

8. The method of claim 1, wherein providing a rough model of the object includes also providing a rough model pose.

9. A method for refining a geometric description model of an object using an image of that object, the method comprising:
providing an image of the object;
providing a rough geometric description model of the object;
constructing a refined geometric description model using the image;
using constraints to further refine the refined geometric description model; and
refitting the further refined geometric description model to the found sub-model poses to provide a new pose of the further refined model.

* * * * *